(12) United States Patent
Fujii et al.

(10) Patent No.: US 7,872,092 B2
(45) Date of Patent: Jan. 18, 2011

(54) POLYESTER RESIN SHEET FOR PHOTOVOLTAIC BATTERIES, LAMINATE FORMED BY USING THE SAME, PHOTOVOLTAIC BATTERY BACKSIDE PROTECTION SHEET, AND MODULE

(75) Inventors: Hideki Fujii, Kyoto (JP); Masahiro Kawaguchi, Kyoto (JP)

(73) Assignee: Toray Industries, Inc. (JP)

( * ) Notice: Subject to any disclaimer, the term of this patent is extended or adjusted under 35 U.S.C. 154(b) by 80 days.

(21) Appl. No.: 12/282,382

(22) PCT Filed: Mar. 14, 2006

(86) PCT No.: PCT/JP2006/304998

§ 371 (c)(1),
(2), (4) Date: Sep. 24, 2008

(87) PCT Pub. No.: WO2007/105306

PCT Pub. Date: Sep. 20, 2007

(65) Prior Publication Data

US 2009/0065055 A1    Mar. 12, 2009

(51) Int. Cl.
*C08G 63/02*    (2006.01)
*C08G 63/00*    (2006.01)

(52) U.S. Cl. .................. 528/272; 136/259; 428/219; 528/176; 528/271; 528/279

(58) Field of Classification Search .............. 136/259; 428/219; 528/176, 271, 272, 279
See application file for complete search history.

(56) References Cited

FOREIGN PATENT DOCUMENTS

| JP | 03-0767 27 | 4/1991 |
|---|---|---|
| JP | 07-37098 | 4/1995 |
| JP | 7-37098 B2 | 4/1995 |
| JP | 11-186575 | 7/1999 |
| JP | 11-186575 A | 7/1999 |
| JP | 11-261085 | 9/1999 |
| JP | 11-261085 A | 9/1999 |
| JP | 2002-26354 A | 1/2002 |
| JP | 2002-26354 A | 1/2002 |
| JP | 2002-83988 A | 3/2002 |
| JP | 2002-100788 A | 4/2002 |
| JP | 2003-168814 A | 6/2003 |
| JP | 2004-247390 A | 9/2004 |
| WO | 2004/023565 A1 | 3/2004 |

*Primary Examiner*—Terressa M Boykin
(74) *Attorney, Agent, or Firm*—DLA Piper LLP (US)

(57) ABSTRACT

An objective of the present invention is to provide an inexpensive and excellent polyester resin sheet for photovoltaic batteries which enhances the electrical transduction efficiency of photovoltaic battery by improving the hydrolysis resistance and heat resistance, and further enhancing the screening potency, as well as a photovoltaic battery using the same. The polyester resin sheet for photovoltaic batteries comprises a polyester resin layer formed by using one or more layers having a number average molecular weight of 18500 to 40000 in which at least one or more layers having 5 to 40% by weight of titanium dioxide is formed on the polyester resin layer, wherein a light transmittance at wavelengths of 300 to 350 nm is 0.005 to 10%, a relative reflectance is 80% or more and 105% or less, an apparent density is 1.37 to 1.65 g/cm³, an optical density is 0.55 to 3.50, and the variation in optical density has a fluctuation of within 20% from the center value.

18 Claims, 1 Drawing Sheet

POLYESTER RESIN SHEET FOR PHOTOVOLTAIC BATTERIES, LAMINATE FORMED BY USING THE SAME, PHOTOVOLTAIC BATTERY BACKSIDE PROTECTION SHEET, AND MODULE

RELATED APPLICATIONS

This is a §371 of International Application No. PCT/JP2006/304998, with an international filing date of Mar. 14, 2006 (WO 2007/105306 A1, published Sep. 20, 2007).

TECHNICAL FIELD

The present invention relates to a back sheet for photovoltaic batteries which is inexpensive and excellent in environment resistance (hydrolysis resistance, weatherability, and the like) and further suitable for a field which requires the reflectance of the back side on which sunlight is incident as well as a photovoltaic battery formed by using the same.

BACKGROUND

In recent years, photovoltaic batteries or clean energy sources have been attracting attention as next-generation energy sources. The applications ranging from the architecture field to electric/electronic parts have been developed. The structure of the photovoltaic battery unit is based on a structure of a high light transmission material, photovoltaic battery module, filled resin layer, and back sealing sheet. It is integrated into the house roof and used for electric/electronic parts. The thermoplastic resin sheet is used as the back sealing sheet which is used for some items of the structure of photovoltaic battery. With reference to the thermoplastic resin sheet (for photovoltaic batteries), the durability in the natural environment (hydrolysis resistance, weatherability) is strongly required. Furthermore, the improvement in electrical transduction efficiency of sunlight of photovoltaic batteries is also required. Therefore, the reflected light of a back sealing film of photovoltaic batteries is also used so as to be converted into electricity. Additionally, lightweight properties, strength, and processability of batteries are being requested. Japanese Patent Application Laid-Open (JP-A) No. 2002-26354 (page 2, the first column, lines 32 to 39) discloses the use of a base polymer having a large number average molecular weight as a back sheet for photovoltaic batteries with a low specific gravity. However, the resistance to UV rays and screening potency are inferior and thus further improvement is required.

In the case of the photovoltaic battery module used outdoors, a structure in which the photovoltaic battery is formed on the tempered glass board or a metal substrate with a synthetic resin is generally used to ensure reliability by improving the mechanical strength or the environment resistance which does not easily deteriorate under environmental atmosphere. When the modular structure by the laminating method is more specifically described, a structure in which layers of ethylene-vinyl acetate copolymer (hereinafter referred to as "EVA") sheet/a photovoltaic battery/an EVA sheet/an aluminum foil sandwiched between vinyl fluoride sheets (hereinafter referred to as "aluminum-fluorine composite sheet") are in this order laminated and heat-crimped on a tempered glass is used.

When the photovoltaic battery is a thin-film photovoltaic cell comprising an amorphous silicon, a photovoltaic battery obtained by directly forming the photovoltaic battery on the tempered glass board, laminating the EVA sheet and the aluminum-fluorine composite sheet, and heat-crimping it is used. It is a known fact that a polyethylene resin, a polyester resin, and a fluorine film are used as a back sealing film for photovoltaic batteries (see JP-A No. 11-261085 (page 2, the 36th line of the first column to the 4th line of the second column) and JP-A No. 11-186575 (the 36th line of the first column of page 2 to the 22nd line of the first column of page 3)).

A polyester film having air bubbles (see Japanese Patent Application Publication (JPB) No. 7-37098 (the 1st line of the first column of page 1 to the 23rd line of the second column of page 3)) is known. However, these films are not used as a back sheet for photovoltaic batteries.

The conventional sheets had the following problems. Biaxial stretched polyester resin sheets which are conventionally used in the field lack in hydrolysis resistance which is most required for the environment resistance, and thus the use thereof in the field has been limited. As for the biaxial stretched polyester resin sheet which is white-colored, the reflectance is improved, however, the sheet lacks in the hydrolysis resistance. Thus, the use thereof in the field has been limited.

Further, the fluorine sheet is excellent in hydrolysis resistance or weatherability. However, it lacks in gas barrier properties and the sheet nerve is weak, which is disadvantageous. The sheet has been thus used by laminating metallic foils such as aluminium to improve barrier properties and to provide the strength of back sealing material. Even if the film in Patent document 1 which is invented to solve these problems is used, peeling from the lamination interface is occurred, which causes troubles when the photovoltaic battery is produced or when it is installed on a roof.

Although the sheet formed by using polyester sheet is relatively inexpensive, there has been a difficulty in heat resistance when exposed to high temperatures (100 to 120° C.).

It could thus be helpful to provide an inexpensive and excellent polyester resin sheet for photovoltaic batteries which enhances the electrical transduction efficiency of photovoltaic batteries by improving the hydrolysis resistance and interfacial-peeling prevention and further enhancing the screening potency as well as a photovoltaic battery formed by using the same from the background of the related art.

Enhancement of the electrical transduction efficiency of photovoltaic batteries by improving the hydrolysis resistance and heat resistance and further enhancing the screening potency has been intensively examined from the background of the related art. We have thus developed polyester resin sheets for photovoltaic batteries which satisfy the specific UV transmittance, relative reflectance, apparent density, optical density, variation in optical density, and number average molecular weight.

That is, we provide, the following:

(1) A polyester resin sheet for photovoltaic batteries, comprising a polyester resin layer formed by using one or more layers having a number average molecular weight of 18500 to 40000 in which at least one or more layers having 5 to 40% by weight of titanium dioxide is formed on the polyester resin layer, wherein a light transmittance at wavelengths of 300 to 350 nm is 0.005 to 10%, a relative reflectance is 80% or more and 105% or less, an apparent density is 1.37 to 1.65 g/cm$^3$, an optical density is 0.55 to 3.50, and the variation in optical density has a fluctuation of within 20% from the center value;

(2) The polyester resin sheet for photovoltaic batteries according to (1), wherein the variation in optical density has a fluctuation of within 15% from the center value;

(3) The polyester resin sheet for photovoltaic batteries according to (1), wherein the total light transmittance of a thermoplastic resin sheet is 0.005 to 25%;

(4) The polyester resin sheet for photovoltaic batteries according to (1), wherein the thickness of the layer having 5 to 40% by weight of titanium dioxide is 7 to 100% of the total thickness of the polyester resin layer;

(5) The polyester resin sheet for photovoltaic batteries according to any one of (1) to (4), wherein elongation retention before and after aging for 3000 hours is 40 to 100% under conditions of a temperature of 85° C. and a humidity of 85% RH;

(6) The polyester resin sheet, for photovoltaic batteries according to any one of (1) to (5), wherein elongation retention before and after aging for 15 hours is 40 to 100% under conditions of a temperature of 140° C.;

(7) The polyester resin sheet for photovoltaic batteries according to any one of (1) to (6), having a gas and moisture vapor barrier layer;

(8) A polyester resin sheet laminate for photovoltaic batteries, wherein at least the polyester resin sheet according to any one of (1) to (7) and a gas and moisture vapor barrier layer are laminated;

(9) The polyester resin sheet laminate for photovoltaic batteries according to any one of (1) to (7), wherein a moisture vapor transmission rate is 0.5 g/(m$^2$·24 hr) or less using 100 μm conversion factor at a temperature of 40° C. and a humidity of 90% RH in the measurement of moisture vapor transmission rate measurement in accordance with JIS-K-7129;

(10) A photovoltaic battery backside protection sheet, wherein the photovoltaic battery backside protection sheet is the polyester resin sheet for photovoltaic batteries or the polyester resin sheet laminate for photovoltaic batteries according to any one of (1) to (9), used for a back sealing material of photovoltaic batteries; and

(11) A photovoltaic battery module, wherein the photovoltaic battery backside protection sheet according to (10) is used.

There can be provided an inexpensive and excellent thermoplastic resin sheet for photovoltaic batteries which enhances the electrical transduction efficiency of photovoltaic battery by improving the hydrolysis resistance and heat resistance and further enhancing the screening potency, as well as a layered product. The sheet and the layered product can be suitably used for photovoltaic batteries to be used as roofing materials, photovoltaic batteries having flexibility, and electronic parts.

DESCRIPTION OF THE SYMBOLS

Figure 1:
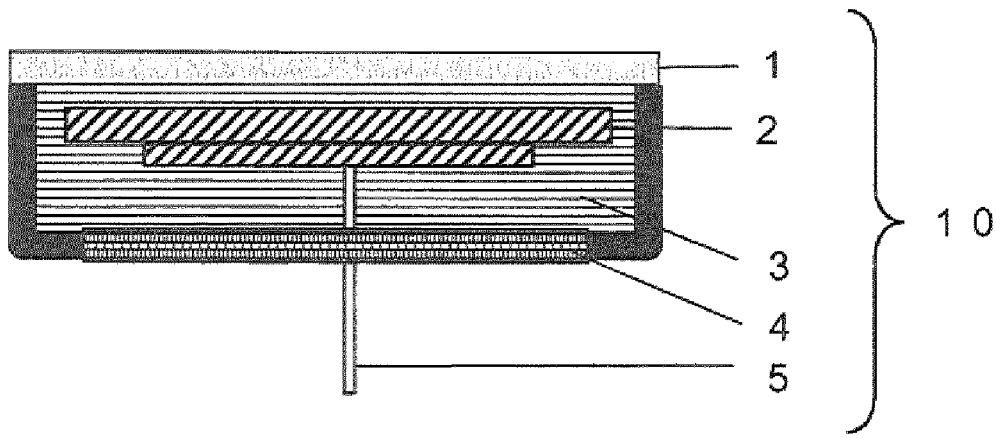
FIG. 1 is a cross-sectional view illustrating a photovoltaic battery formed by using a polyester resin sheet for photovoltaic batteries of the present invention.

1 Total light transmission material
2 Photovoltaic battery cell
3 Filled resin
4 Photovoltaic battery backside protection sheet
5 Lead wire
6 Moisture vapor and gas barrier layer
7 Polyester resin layer (A layer)
8 Polyester resin layer (B layer)
9 Adhesive layer
10 Photovoltaic battery module
20 Thermoplastic resin sheet laminate for photovoltaic batteries
21 Substrate sheet
22 Metal or inorganic oxide layer
30 Thermoplastic resin sheet for photovoltaic batteries

DETAILED DESCRIPTION

The present invention provides a polyester resin sheet for photovoltaic batteries; comprising a polyester resin layer formed by using one or more layers having a number average molecular weight of ~18500 to 40000 in which at least one or more layers having 5 to 40% by weight of titanium dioxide is formed on the polyester resin layer, wherein a light transmittance at wavelengths of 300 to 350 nm is 0.005 to 10% a relative reflectance is 809% or more and 105% or less, an apparent density is 1.37 to 1.65 g/cm$^3$, an optical density is 0.55 to 3.50, and the variation in optical density has fluctuation of within 20% from the center value.

The term "photovoltaic battery" used in the present invention means a system that converts sunlight into electricity (hereinafter referred to as electric conversion). Preferably, the structure of the photovoltaic battery is based on a structure of a high light transmission material, photovoltaic battery module, filled resin layer, and back sealing sheet. For example, in the structure shown in FIG. 1, it is integrated into the house roof and used for electric/electronic parts.

The term "high light transmission material" herein means a material which allows sunlight to efficiently enter and protects the internal photovoltaic battery module. Preferably, glass, high light transmission plastics, films, and the like are used. Further, the photovoltaic battery module is the heart of the photovoltaic battery which converts sunlight into electricity. Semiconductors such as silicon, cadmium-tellurium, and germanium-arsenic are used for the module. Frequently used examples of the semiconductors include single crystal silicon, polycrystalline silicon, amorphous silicon, and the like.

Further, the filled resin layer is used for fixing and protecting the photovoltaic battery module in the photovoltaic battery, and for electrical insulation. In particular, an ethylene vinyl acetate resin (EVA) is preferably used in terms of performance and costs.

The present invention is suitably used as a back sealing sheet of a photovoltaic battery module. The sheet contributes to the improvement of the electrical transduction efficiency of photovoltaic battery by enhancing the function of blocking moisture vapor which is bad for the photovoltaic battery module and the screening potency in the photovoltaic battery, and increasing the reflectance. Further, wavelengths (300 to 350 mm) in the UV region which enter from the back side are screened, thereby obtaining a photovoltaic battery excellent in durability.

The term "polyester resin" in the present invention means a condensation polymer of dicarboxylic acid derivatives and diol derivatives. Usable examples thereof include polyethylene terephthalate, polypropylene terephthalate, polybutylene terephthalate, polyethylene-2,6-naphthalate, poly-1,4-cyclohexanedimethylene terephthalate, and 1,4-cyclohexanedimethanol copolymerized polyethylene terephthalate. Particularly, polyethylene terephthalate is inexpensive and thus it can be used for a wide variety of applications. Further, these resins may be a homo-resin, a copolymer, or a blend. From the viewpoint of heat resistance, the melting point of polyester to be preferably used is preferably 250° C. or more. From the viewpoint of productivity, the melting point of polyester is 300° C. or less. As long as the melting point is within the range, other components may be copolymerized or blended. Further, so long as it is within the range having no trouble from the viewpoint of mechanical characteristics and productivity, additive agents such as lubricants, coloring agents, antistatic agents, and low density agents may be added, for example, in the range of 60% by weight or less.

The term "polyester resin sheet for photovoltaic batteries of the present invention" means a sheet formed by biaxial-stretching and heat-treating an unstretched and nonoriented sheet obtained by melt-molding the above-described polymer. The thickness of the sheet is preferably 20 to 350 micron from the viewpoint of appropriate nerve as the back sealing sheet for photovoltaic batteries, processability, and light-weight properties of photovoltaic battery.

The thickness of the polyester resin sheet for photovoltaic batteries is important to improve the withstand pressure of the partial discharge voltage. A method for increasing the thickness until achieving a target withstand pressure by processes such as a laminating process by coextrusion and a combining process is preferably used.

The term "polyester resin layer" in the present invention means a layer formed of a polyester resin having a number average molecular weight of 18500 to 40000 and it may be composed of a single layer or a plurality of layers. The term "polyester resin sheet" of the present invention means a multilayer which has the polyester resin layer and is configured so as to optionally have another polyester layer, or a single layer.

In the present invention, it is required that the light transmittance of the polyester resin sheet at wavelengths of 300 nm to 350 nm be 0.005 to 10%. The term "light transmittance at wavelengths of 300 nm to 350 nm" in the present invention means a ratio of the incident light of the wavelengths incident on the sheet to a light transmitted on the opposite side. To reduce the UV deterioration, it is required that the transmittance (hereinafter referred to as UV transmittance) at wavelengths (300 to 350 nm) in the UV region of the thermoplastic resin sheet for photovoltaic batteries be set in the range of 0.005 to 10%, preferably 0.01 to 7%, and further preferably 0.05 to 5%. The light of the UV range which deteriorates the polyester resin sheet for photovoltaic batteries is included in the wavelength of the entered light. When the light can be shut out near the surface, there is little penetration of the wavelength in the UV region into an inner layer and there is little UV deterioration of inner layer portion. Therefore, the weatherability is excellent. When the WV transmittance exceeds 10%, molecular chains are cut by the energy at the UV wavelength over time and mechanical characteristics are reduced, which is not preferable. Further, the sheet also turns yellow in color and its deterioration is clear from its appearance.

An example of a method for controlling the light transmittance (UV transmittance) at wavelengths of 300 nm to 350 nm includes a method for controlling by controlling a blended ratio of titanium dioxide, as described below.

When the blended ratio of titanium dioxide is increased, the screening potency is increased and the transmittance at wavelengths of 300 to 350 nm is significantly decreased at the same time. A UV transmittance of the thermoplastic resin sheet is preferably 0.005 to 10%. The effect is produced when the blended ratio of titanium dioxide (content of titanium dioxide based on the layer containing titanium dioxide) exceeds 5% by weight. The UV transmittance is preferably 7% by weight or more, and further preferably 10% by weight or more. From the viewpoint of productivity and sheet strength, the upper limit of the concentration of titanium dioxide is preferably 40% by weight or less. The range of light transmittance at wavelengths of 300 to 350 nm in the present invention can be obtained by including the layer having the content of titanium dioxide in the polyester resin layer.

In the present invention, it is required that the relative reflectance of thermoplastic resin sheet be 80% to 105%. It is more preferably 83% to 105%, and further preferably 85 to 105%. When it is less than 80%, the optical loss is great, which hardly contributes to electrical transduction efficiency and thus it is not preferable.

The term "relative reflectance" used in the present invention means a reflectance in which the reflectance (base value) obtained when measured at a wavelength of 560 nm by using alumina oxide as a standard white plate is 100% and the measured value in the sample is converted as a numerical value based on the base Value. When the relative reflectance is in the range of the present invention, the light which leaks from a gap through the photovoltaic battery module is diffusely reflected to the incident light, thereby allowing the light to be delivered to a photovoltaic battery cell again. Since the illumination intensity can be improved, the electrical transduction efficiency of the photovoltaic battery is improved.

In the present invention, it is required that the apparent density of the polyester resin sheet be 1.37 to 1.65 g/cm$^3$.

The term "apparent density" herein means a numerical value which is calculated from the thickness, area, and weight of a whole sheet stacked with the multilayer or the single layer. When inorganic particles with a high specific gravity are added, the refractive index difference becomes large at an interface, which contributes to reflective performance. The lower limit of the apparent density which contributes to the reflectance is 1.37 g/cm$^3$ and the upper limit is up to 1.65 g/cm$^3$ taking into consideration of lightweight properties of photovoltaic battery. A method for controlling the apparent density to be 1.37 to 1.65 g/cm$^3$ can be achieved by controlling the type of polyester resin, the type of inorganic particles, and the blended ratio of inorganic particles. Preferable examples of the inorganic particle to be used include talc, magnesium oxide, titanium dioxide, zinc dioxide, calcium carbonate, barium sulfate, gypsum, and the like. When titanium dioxide among them is used, wavelengths in the UV region are diffusely-reflected. Thus, it is significantly effective for the resistance to UV rays.

In addition, the use of a fluorescent brightener such as 4,4'-bis(2-benzoxazolyl)stilbene is effective in increasing the whiteness degree.

In the present invention, it is required that the optical density when measured with a Macbeth optical density meter be 0.55 or more, and more preferably 0.60 or more. The higher upper limit is theoretically preferable. From the viewpoint of productivity and sheet strength, it is 3.5 or less, preferably 3.0 or less, and further preferably 2.5 or less. The term "optical density" to be used in the present invention means that the screening potency is higher as the numerical value quantified as an indicator of the screening potency is higher. In the present invention, it means the value measured with an optical density meter (TR-524: manufactured by Macbeth) under the conditions described below. The reason why the screening potency is required for the thermoplastic resin sheet for photovoltaic batteries is to impart the function of reflecting sunlight leaking from the gap of the upper part of the photovoltaic battery, electrically converting the reflected light, and improving the electrical transduction efficiency. Particularly, the thermoplastic resin sheet for photovoltaic batteries which is located in the lower part of the photovoltaic battery module is necessary to prevent the entered light leaking from the gap from leaking outside of the photovoltaic battery. When the optical density is less than 0.55, the entered light goes outside of the photovoltaic battery. In this case, it cannot be used again for electrical conversion in the photovoltaic battery cell and thus the improvement in electrical transduction efficiency cannot be expected. Consequently, it is not preferable. When the blended ratio of inorganic particles such as titanium dioxide is increased, the screening potency is increased and the transmittance is significantly decreased at the same time. The optical density being an indicator of the screening potency is preferably 0.55 to 3.5 as described above. The effect is produced when the blended ratio of titanium dioxide exceeds 5% by weight. The concentration of titanium dioxide is preferably 7% by weight or more, and further preferably 10% by weight or more. From the viewpoint of productivity and sheet strength, the upper limit of the concentration of titanium dioxide is preferably 40% by weight or less. The range of the optical density in the present invention can be obtained by including the layer having the content of titanium dioxide based on the layer containing titanium dioxide in polyester resin layer.

In the present invention, it is required that the variation in optical density when measured with the Macbeth optical density meter have a fluctuation of within 20% from the center value. Variations in the optical density are expressed by (maximum value−minimum value)/center value. For example, when the center value of the optical density is 1.0, the variation in optical density is in the range of 0.2 and the optical density needs to be in the range of 0.9 to 1.1. Preferably, the variation in optical density has a fluctuation of within 15% from the center value. Further preferably, they have a fluctuation of within 10% from the center value. It is required that the variation in optical density be uniform in the surface of the photovoltaic battery module. Therefore, it is necessary to be satisfied by the current general-purpose size (1.5 m in length×1 m in width). With reference to the variation in optical density, by sampling to the size of 1.5 m in a longitudinal direction×1 m in a cross direction per 100 m in a longitudinal direction from the center of a product roll and further sampling four corners of the cut sample (1.5 m×1.0 m) to 10 cm×10 cm, the resulting samples (10 cm×10 cm) were used and the optical density was measured for 3 times. The resulting value was the optical density. The variation in optical density was calculated from the maximum, minimum, and central values of the optical density (the number of data: 20) when the measurement was carried out for 5 times per a product roll, which was used as the variation in optical density. When the variation in optical density exceeds 20%, this affects the variation in UV transmittance, the variation in total light transmittance, and the variation in relative reflectance. It is not preferable in terms of performance and quality level. To allow the variation in optical density to have a fluctuation of within 20%, it is necessary to reduce the classification of a raw material chip. For example, when raw material chips having a different specific gravity are used, the reduction in classification can be achieved by changing the size of the chips. The specific gravity of titanium dioxide is 3.9 to 4.2 g/cm$^3$ and the specific gravity of polyester is 1.2 to 1.4 g/cm$^3$. The specific gravity of a master chip containing 50% by weight of titanium dioxide is 2.5 to 2.8 g/cm$^3$. Conventionally, the shape of the master chips was cylindrical (length: 5.95 to 8.05 mm, width: 3.20 to 4.80 mm, height: 1.70 to 2.30 mm). In the case of the chip shape, the problem is that when the concentration of titanium dioxide is diluted to 5 to 40% by weight, the master chip containing titanium dioxide and the polyester chip are classified in the hopper of the upper part of the extruder and the master chip with a higher specific gravity is discharged first. For that reason, the sheet discharged first has a high titanium dioxide content and thus the optical density is high. In the case of the sheet discharged later, the concentration of titanium dioxide is decreased, the optical density is reduced, and the variation in optical density becomes large. Then, the shape of a titanium dioxide master chip is changed into a cylindrical shape with the following size: length: 2.40 to 4.60 mm, width: 3.20 to 4.80 mm, and height: 1.70 to 2.30 mm, which can be used as the range of the variation in optical density in the invention of the present application.

To satisfy hydrolysis resistance in the present invention, it is required that the polyester resin sheet have a polyester resin layer with a number average molecular weight of 18500 or more. Although a higher upper limit is better, extrusion cannot be substantially performed when the number average molecular weight exceeds 40000. The molecular weight is preferably 35000 or less from the viewpoint of melt molding properties and biaxial stretching properties. That is, the number average molecular weight is 18500 to 40000, more preferably 19000 to 35000, and further preferably 20000 to 30000. The number average molecular weight used in the present invention is obtained by measuring with a gel permeation chromatograph (GPC) as described below and the number average molecular weight is an indicator of the polymerization degree. When the number average, molecular weight is in the range of the present invention, even if hydrolytic reaction of the polyester resin proceeds, time degradation can be advantageously reduced as compare to a case where the number average molecular weight is lower than 18500. This is because the polymerization degree at the reaction start point is high.

To adjust the number average molecular weight to the range of the present invention, the high polymerization temperature is changed to, for example 190 to 230° C. and the polymerization time is changed to 10 to 23 hours in the polymerization of thermoplastic resin. Then, polymers having different number average molecular weights can be obtained.

In the present invention, it is preferable that the total light transmittance of the polyester resin sheet be 0.005 to 25%. The term "total light transmittance" means the value measured using a haze meter HGM-2DP (manufactured by Suga Test Instruments Co., Ltd.) in accordance with JIS-K-7105. The total light transmittance serves as an indicator of the screening potency. Particularly, reduction of the total light transmittance at wavelengths in the visible light region allows the condition where the sunlight to which wavelengths contributing to power generation are entered is transmitted and escapes to the outside of the photovoltaic battery to be prevented. When 5 to 40% by weight of titanium dioxide described above is added, the effect of increasing the screening potency becomes significant. When the additive amount is less than 5% by weight, the screening potency is decreased and thus a target total light: transmittance cannot be reduced. When the additive amount is 40% by weight, clogging of a film forming filter is caused and a sheet itself is easily torn, which leads to the worsening of productivity and thus is not preferable. The concentration of titanium dioxide is preferably 7% by weight or more, and further preferably 10% by weight or more. The range of the light transmittance of the present invention can be obtained by including the layer having the content of titanium dioxide based on the layer containing titanium dioxide in polyester resin layer. As long as the concentration of titanium dioxide satisfies the range, a plurality of layers may be included and a high-concentration layer may be included.

In the present invention, it is preferable that the thickness of a polyester resin layer having a number average molecular weight of 18500 or more be 7 to 100% based on the thickness of the polyester resin sheet as a whole. The thickness is preferably 10% or more, further preferably 15% or more. That is, the whole sheet needs not to have a number average molecular weight of 18500 to 40000 and it is only necessary that 7% or more of the thickness in the film thickness direction be composed of a high-molecular weight polyester resin having a number average molecular weight of 18500 to 40000. It is preferable to form the outmost surface of the polyester resin sheet for photovoltaic batteries using the polyester resin layer whose thickness is 7% or more, more preferably 10% or more based on the thickness of the sheet as a whole and whose number average molecular weight is in the range of 18500 to 40000 to impart hydrolysis resistance. Even if less than 7% of the thickness in the layer thickness direction is composed of a high-molecular weight polyester resin having a number average molecular weight of 18500 to 40000, it is inferior in hydrolysis resistance, strong elongation retention is reduced, and the deterioration is rapid. Thus, it is not preferable. When being laminated in 7% or more of the thickness, it is effective for the interlayer peeling from the lamination interface.

In the present invention, it is preferable that a polyester resin layer having a number average molecular weight of 18500 or more be formed of a plurality of layers, and the thickness of the layer having 5 to 40% by weight of titanium dioxide be 7 to 100% of the total thickness of the polyester resin layer. Preferably, the thickness of the layer is 10% or more of the total thickness of the polyester resin layer. Further preferably, the thickness of the layer is 15% or more of the total thickness of the polyester resin layer. The content of titanium dioxide is more preferably in the range of 7 to 30% by weight, and further preferably in the range of 10 to 20% by weight. In the polyester resin layer, both of film-forming property and optical property can be improved by separating the layer containing a high concentration of titanium dioxide from other layers.

To effectively prevent the hydrolytic deterioration of the polyester resin sheet for photovoltaic batteries of the present invention, it is more preferable that polyester resin layers having an average molecular weight of 18500 to 40000 be laminated on both sides.

In the present invention, it is preferable that elongation retention after aging for 3000 hours be 40 to 100% under conditions of a temperature of 85° C. and a humidity of 85% RH. The aging for 3000 hours under conditions of a temperature of 85° C. and a humidity of 85% RH is one of the tests to examine the hydrolysis for 25 years in the outdoor exposure state as the thermoplastic resin sheet for photovoltaic batteries. To satisfy the elongation retention, it is preferable that a polyester resin layer having a number average molecular weight of 18500 to 40000 be included, the layer be placed on the outermost layer, and the thickness of the layer be 7% or more of the total thickness. When the film layer is less than 7%, deterioration may occur from the outermost layer and elongation retention may be less than 40%.

In the present invention, it is preferable that elongation retention after aging for 15 hours be 40 to 100% under condition of a temperature of 140° C. Photovoltaic batteries are used outdoors and thus they may be exposed to high temperatures, for example, desert and tropical zone. In a sealed region, the temperature rises to ambient temperature or more. Since the photovoltaic battery module itself produces heat when generating electricity, the heat resistance under the back sheet using condition is also an important item. The above-described evaluation can be replaced by an accelerated test of heat resistance. To allow elongation retention after aging for 15 hours to be 40 to 100% under condition of a temperature of 140° C., it is preferable that a polyester resin layer having a number average molecular weight of 18500 to 40000 be included, the layer be placed on the outermost layer, and the thickness of the layer be 7% or more of the total thickness. When the polyester resin layer is less than 7%, deterioration may occur from the outermost layer and elongation retention may be less than 40%.

Figure 2:
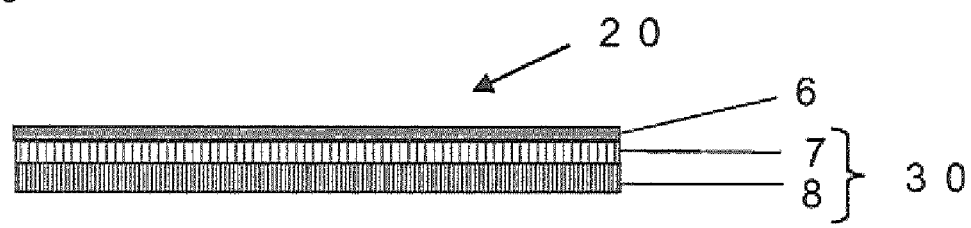
FIG. 2 is a cross-sectional view illustrating an example of a polyester resin sheet laminate for photovoltaic batteries in which a gas barrier layer is formed on one side of a film.
Figure 3:
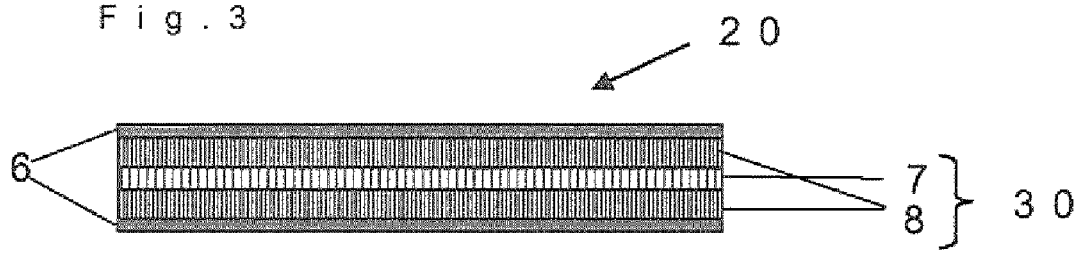
FIG. 3 is a cross-sectional view of another example illustrating a structure of the polyester resin sheet laminate for photovoltaic batteries in which the gas barrier layer, is formed between two layered films.

The polyester resin sheet laminate for photovoltaic batteries of the present invention is formed by laminating the polyester resin sheet and the gas and moisture vapor barrier layer. The term "gas barrier layer" used in the present invention means a layer having barrier properties of moisture vapor in which, for example, metal or oxide of metal is provided on the surface of the sheet or between two-layer sheets as a layer. As for the polyester resin sheet for photovoltaic batteries of the present invention, to block the entry of moisture vapor from the outside which is the worst for the photovoltaic battery module, the sheet in which the moisture vapor barrier layer (moisture vapor blocking layer) is provided is preferably used as shown in FIGS. 2 and 3. In the case of the layered product which does not have the gas and moisture vapor barrier layer on the outermost layer, moisture vapor barrier properties are poor. The failure in which the gas and moisture vapor enter into a circuit in the photovoltaic battery module as well as short-circuits may occur.

With reference to the polyester resin sheet laminate for photovoltaic batteries of the present invention, it is preferable that a moisture vapor transmission rate be 0.5 g/(m$^2$·24 hr) or less using 100 μm conversion factor at a temperature of 40° C. and a humidity of 90% RH in the measurement of moisture vapor transmission rate measurement in accordance with JIS-K-7129. A metal or metal oxide layer is preferably used so that a moisture vapor transmission rate measured in accordance with JIS-K-7129 is 0.5 g/(m$^2$·24 hr) or less (thickness, 100 μm conversion factor), preferably 0.25 g/(m$^2$·24 hr) or less (thickness 100 μm conversion factor), and further preferably 0.10 g/(m$^2$·24 hr) or less (thickness, 100 μm conversion factor). As such a metal, aluminium is preferably used. Further, as an oxide of metal, oxide of silicon or aluminum is preferably used. When moisture vapor of 0.5 g/(m$^2$·24 hr) or more (thickness, 1.00 μm conversion factor) is passed, hydrolysis of the polyester resin sheet for photovoltaic batteries is facilitated. Further, the strength and ductility are deteriorated and thus it becomes brittle. In addition, the trouble of the photovoltaic battery module is caused.

The photovoltaic battery backside protection sheet of the present invention is the polyester resin sheet for photovoltaic batteries or the polyester: resin sheet laminate for photovoltaic batteries and the polyester resin sheet for photovoltaic batteries used for a back sealing material of photovoltaic batteries. The polyester resin sheet for photovoltaic batteries of the present invention serves as the backside protection sheet and can protect the photovoltaic battery module from dirt, moisture vapor, and the like. Thus, it can be suitably used as the back sealing material of photovoltaic batteries.

The photovoltaic battery module of the present invention is a photovoltaic battery module obtained by using the photovoltaic battery backside protection sheet. The photovoltaic battery module obtained by using the polyester resin sheet for photovoltaic batteries which satisfies the characteristics as a backside protection sheet can be suitably used as the photovoltaic battery. Next, an example of a method for producing the polyester resin sheet for photovoltaic batteries of the present invention will be described.

For example, terephthalic acid or derivative thereof and ethylene glycol are subjected to ester interchange reaction by a well-known method. Examples of a reaction catalyst include alkali metal compounds, alkaline earth metal compounds, zinc compounds, lead compounds, manganese compounds, cobalt compounds, aluminium compounds, antimony compounds, and titanium compounds. Examples of a coloring agent include phosphorus compounds. It is preferable that an antimony compound or a germanium compound and a titanium compound be added as polymerization catalysts. For such a method, in the case of adding, for example, a germanium compound, it is preferable to add germanium compound powders as they are.

A preferable example of the method for controlling the number average molecular weight of the polyester resin of the present invention to be 18500 to 40000 includes a so-called method of solid phase polymerization which comprises the steps of polymerizing a usual polyester resin having a number average molecular weight of 18000 by the above-described method and heating at a temperature ranging from 190° C. to a temperature being less than a melting point of polyester resin under reduced pressure or circulation of inert gas such as nitrogen gas. The method can increase the number average molecular weight without increasing the amount of the terminal carboxyl group of polyester resin.

Subsequently, when the polyester resin sheet for photovoltaic batteries is formed of the polymer, a method including the steps of drying the polymer, if necessary, and multilayer-laminating the polyester resin delivered from different passages by using two or more extruders with a multimanifold die, a field block, a static mixer, a pinole, and the like can be used. Alternatively, these methods may be optionally combined.

The multilayer-laminated sheet that is discharged from a die is extruded onto a cooling body such as a casting drum, which is then cooled and solidified to form a casting sheet. In this case, it is preferable that the sheet be adhered tightly to the cooling body such as a casting drum by an electrostatic force by using an electrode with shapes such as a wire-shape, a tape-shape, a needle-shape, or a knife-shape, which is then quenched and solidified.

The casting sheet thus obtained may be optionally subjected to biaxial stretching. The term "biaxial stretching" means stretching in the vertical and horizontal directions. The stretching may be sequential biaxial stretching or simultaneous biaxial stretching. Further, the re-stretching may be performed in a vertical and/or horizontal direction.

The term "stretching in the vertical direction" means stretching for providing a molecular orientation in the longitudinal direction to a film. It is usually given by a roll peripheral speed difference. The stretching may be performed at one stage. Alternatively, the stretching may be performed at multiple stages with a plurality of roll pairs. The stretching magnification varies depending on the type of resin. Usually, the area magnification is preferably 2 to 15 times. For example, when polyethylene terephthalate is used, the stretching magnification in the vertical direction is preferably 2 to 4 times.

Then, to stretch the film in the horizontal direction, the film is passed through a rail set to the stretching magnification of 2 to 4 times in the state that the clip holds the end of the film, and stretched in the horizontal direction (machine cross-direction). Ambient temperature is determined so that the stretching temperature of the film is 85 to 110° C., and the film is stretched in the horizontal direction. In the subsequent step, heat treatment is performed at 180 to 240° C. to obtain dimensional stability, and the polyester resin sheet for photovoltaic batteries of the present invention is given.

The method for improving the reflectance is herein a method for adding a large amount of fine particles having a number average particle diameter of 0.1 to 1 μm to polyester in the polyester resin sheet and uniformly dispersing to form a sheet shape. The relative reflectance is improved by the diffuse reflection of the fine particles. The method for adding fine particles is preferably a compounding method. In the present invention, titanium dioxide is used as fine particles. Specifically, it is preferable that a polyester containing 50% by weight of titanium dioxide particles be prepared as a master chip and diluted to reach a target concentration. Usable examples of a dispersing auxiliary agent include polyalkylene glycol and copolymer thereof. Specifically, polyethylene glycol, polypropylene glycol, and polybutylene terephthalate-polytetramethylene glycol copolymer are preferably used.

Subsequently, to impart gas and moisture vapor barrier properties to the sheet composed of the polyester resin sheet for photovoltaic batteries of the present invention, there is a technique of laminating the gas and moisture vapor barrier layer in which the layer is directly formed on the surface of the polyester resin sheet for photovoltaic batteries of the present invention by a well known method such as a vacuum metallizing method or a sputtering method, as shown in FIG. 2. It is preferable that the thickness be usually in the range of 100 to 700 Å. The barrier layer does not need to be one layer and it may be provided on both sides of the sheet depending on the needs of the barrier property, as shown in FIG. 3.

Figure 4:
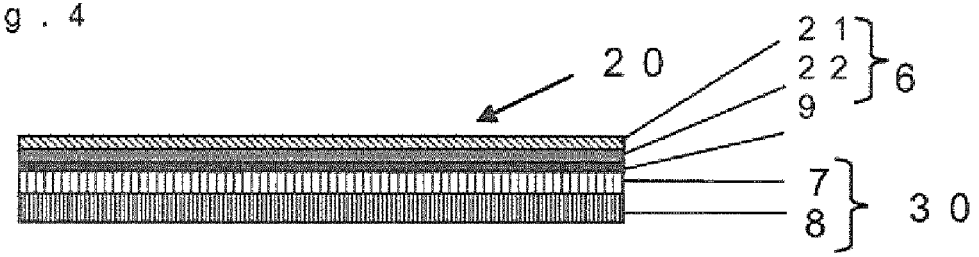
FIG. 4 is a cross-sectional view illustrating an example of a structure of the polyester resin sheet laminate for photovoltaic batteries in which the gas barrier layer (substrate sheet+ metal or inorganic oxide layer) is formed on one side of the film.

On the other hand, there is a method that the barrier layer is not directly formed on the sheet, as shown in FIG. 4, a laminate is produced by laminating the gas barrier sheet in which metal or inorganic oxide layer is formed on another substrate sheet on the surface of the polyester resin sheet for photovoltaic batteries of the present invention by using an adhesive layer, and the like. Further, a method for laminating a metallic foil (for example, aluminum foil) on the surface of the film can be used. It is preferable that the thickness of the metallic foil in such a case be in the range of 10 to 50 μm from the viewpoint of processability and gas barrier properties. In addition, it is not always necessary that the gas barrier layer be disposed on the surface of the sheet. For example, it may be sandwiched between the two-layered films.

The structure of the photovoltaic battery backside protection sheet formed by using the polyester resin sheet for photovoltaic batteries of the present invention is not limited to the lamination of the gas and the moisture vapor barrier sheet. The polyester resin sheet for photovoltaic batteries of the present invention may be laminated with one or more sheets selected from, for example, a reflective sheet with further excellent light reflectance, a plastic sheet with a thickness of 100 μm or more to improve electrical insulation properties, a black-colored or highly thermally conductive radiation sheet to improve heat dissipation properties, and a fluorine resin sheet to further increase weatherability in addition to the barrier sheet. The laminating order is not particularly limited, but it is preferable that the sheet having a light reflective function be located at the side close to the photovoltaic battery cell and the sheet having weatherability be located at the outermost side. In the present invention, a product which is laminated via an adhesive or the like is a laminate and a product which is laminated not via the adhesive or the like is a sheet.

The photovoltaic battery module of the present invention has, for example, the structure shown in FIG. 1. That is, base materials (glass, film, and the like) having a high light transmittance are placed on the surface and a photovoltaic battery module such as silicon is fixed by applying a lead wire which can take electricity and using a filled resin such as EVA resin. Then, the polyester resin sheet for photovoltaic batteries of the present invention is fixed on the back of the materials by using the photovoltaic battery backside protection sheet for sealing the backside, and the photovoltaic battery module is obtained.

Hereinafter, physical properties, evaluation method thereof, and criterion of evaluation which are used in the present invention will be described.

Physical Properties, Evaluation Method Thereof, and Criterion of Evaluation (1) Number Average Molecular Weight (Mn)

Molecular weight calibration was performed using polystyrene (PS) (reference standard) before the polyester resin sheet for photovoltaic batteries is measured at room temperature (23° C.) with 244 type gel permeation chromatograph GCP-244 (manufactured by WATERS), two columns: Shodex K 80M (manufactured by Showa Denko K.K.), and one column: TSKGEL-G2000Hx1 (manufactured by TOSOH CORPORATION). Coefficient ($A_1$) of the third approximation (i) was calculated using elution volume (V) and molecular weight (M), and drawings were created:

$$\mathrm{Log}(M) = A_0 + A_1 V + A_2 V^2 + A_3 V^3 \qquad (\mathrm{i}).$$

After the calibration and creation of drawings, a sample of the polyester resin sheet for photovoltaic batteries was dissolved in a solvent of orthochlorophenol/chloroform (volume ratio: 1/4) so as to be 0.2% (wt/vol). The injection amount to chromatograph was 0.400 ml and the injection was performed at a flow rate of 0.8 ml/min. As a detector, R-401 differential-refractive-index detector (WATERS) was used, and the number average molecular weight was calculated by the following equation:

$$\text{Number average molecular weight}(Mn) = \Sigma NiMi / \Sigma Ni.$$

Molar fraction; Ni, molecular weight (Mi) corresponding to each retention volume (Vi)

A composite film or a single film was sampled and measured. The complex film was sampled by polishing the film while being microscopically-observed.

(2) Content of Titanium Dioxide

A sheet was used as a sample, and the content of titanium element being characteristic of titanium dioxide was calculated with fluorescent-X-ray elemental analysis apparatus (MESA-500W type, manufactured by HORIBA, Ltd.). The titanium dioxide content was converted from the amount of titanium element.

(3) Optical Density

The transmitted light flux was measured with an optical density meter (TR-524, manufactured by Macbeth) and calculated by the following equation:
Light source: visible light
Spectral composition: tungsten-filament lamp having a color temperature of 3006° K.
Measurement environment: temperature, 23° C.±3° C., humidity, 65±10% RH
Calculation equation: optical density=$\log_{10}(F_0/F)$
F: Transmitted light flux of the sample, $F_0$: Transmitted light flux without the sample (4) Variation in Optical Density (%)

The variation in optical density was represented by [(Fmax−Fmin)/Fave]×100:
Fmax: maximum value of 20 data, Fmin: minimum value of 20 data, Fave: average value of 20 data The optical density was measured in the same manner as described in (3).

With reference to the variation in optical density, five parts from the central part of a product roll were sampled in the size of 1.5 m in a longitudinal direction×1 m in a cross direction per 100 m in a longitudinal direction and four corners (1.5 m×1.0 m) were cut to 10 cm×10 cm. The samples were used and the optical density was measured for 3 times. The average of values measured for 3 times was the optical density. The variation in optical density was calculated from the maximum, minimum, and central values of the optical density (the number of data: 20, five parts×4 samples) when the measurement was carried out for 5 times per a product roll, which was used as the variation in optical density.

(5) Apparent Density

The apparent density was measured with an electromagnetic scale (SD-120L, manufactured by Kensei Kogyo K. K.).
N=the measurement was performed for 3 times and the average was employed.

(6) Hydrolysis Resistance

The film was subjected to aging at 85° C. in an atmosphere of a humidity of 500 RH and elongation at break of the sheet was measured with ASTM-D 61T. The ratio (retention) when elongation at break without aging was 100% was compared and evaluated by the following criteria:
Aging time: 0 hr (100%), 3000 hr;
Very good: the retention is 50 to 60% or more;
Good: the retention is 50 to 60%;
Poor: the retention is 40 to 50%; and
Bad: the retention is less than 40%.

(7) Weatherability

Five cycles of the following cycle were carried out with an accelerated test device, Eye Super UW tester. The elongation retention was determined in the same manner as described above and then evaluated according to the same criteria as described above.
One cycle: After performing the ultraviolet irradiation at a temperature of 60° C. in an atmosphere of a humidity of 50% RH for 8 hours, aging for 4 hours in a dew condensation state (temperature: 35° C., humidity: 100 RH);
Ultraviolet irradiation strength: 100 mW/cm$^2$;
Good: increase rate of the b value (5 or less);
Poor: increase rate of the b value (5 to 25); and
Bad: increase rate of the b value (25 or more).

(8) Total Light Transmittance

The total light transmittance was measured with a haze meter HGM-2DP (manufactured by Suga Test Instruments Co., Ltd.) in accordance with JIS-K-7105 (1981).

(9) Relative Reflectance

A spectrophotometer (U-3310, manufactured by Hitachi, Ltd.) was used. As the standard white plate, alumina oxide was used for an opening portion for the standard white plate and an opening portion of the specimen. At 560 nm, the angle of gradient of the opening portion of the specimen was 10° and the diffuse reflectance was measured, which was designated as ($T_0$). The reflectance at that time was 100%. Then, the opening portion of the specimen was replaced with the specimen and the diffuse reflectance was measured at 560 nm. Then, the diffuse reflectance was converted into the relative reflectance (R) by using the following equation:

$$R(\%)=T_1/T_0\times100$$

$T_0$: Reflectance of a standard white plate
$T_1$: Reflectance of specimen.

(10) UV (300 to 350 nm) Light Transmittance

The spectrophotometer (U-3310, manufactured by Hitachi, Ltd.) was used. As the standard white plate, alumina oxide was used for an opening portion for the standard white plate and an opening portion of the specimen. At wavelengths of 300 to 350 nm, the angle of gradient of the opening portion of the specimen was 10° and the transmittance in the case of no sample was measured, which was designated, as ($A_0$). The transmittance at that time was 100%. Thereafter, the sample was located in front of the incident light and the transmittance ($A_1$) at 300 to 350 nm was measured at every wavelength of 5 nm. An average of the measured values was UV transmittance T (%):

$$T(\%)=A_1/A_0\times100$$

$A_0$: Transmittance without sample
$A_1$: Transmittance of specimen.

(11) Moisture Vapor Transmission Rate

The moisture vapor transmission rate was measured in accordance with JIS K7129 (1992). The measurement conditions were set to a temperature of 40° C. and a humidity of 90% RH for 24 hours and the values were converted to m² (the thickness was obtained using a conversion factor of 100 μm).

(12) Heat Resistance

The film was subjected to aging in an atmosphere of a temperature of 140° C. and elongation at break of the sheet was measured with ASTM-D 61T. The elongation at break without aging was 100% and the ratio (retention) of the elongation at break to the elongation after aging was calculated. The retention ratio was determined by the following criterion:
    Good: The retention is 40% or more;
    Poor: The retention is 30 to 40%; and
    Bad: The retention is less than 30%.

(13) Processability

A back sealing film of photovoltaic batteries (1 m square) was produced. Taking into consideration the integration property to the photovoltaic battery system, the nerve was determined by the following criteria:
    Good: level that the nerve is appropriate and integration processing can be easily performed;
    Poor: level that the nerve is weak or so strong that there is a little difficulty in integration processing; and
    Bad: level that the nerve is so weak or so strong that there is a clear difficulty in processability.

(14) Dielectric Constant

The dielectric constant was measured in accordance with JIS C2151 (1990).

(15) Thickness of Each Layer

The whole thickness was measured in accordance with JIS C2151 (1990) and pre-treatment was carried out to cut the cross section of the laminated layer in a thickness direction with a microtome. Thereafter, the thickness cross section was image-captured at a magnification (×1000) that could take an overview image of the thickness cross section with a field emission scanning electron microscope (FE-SEM) S-800, manufactured by Hitachi, Ltd. and the thickness of the cross section photograph was measured. A layer containing titanium dioxide can be image-captured as a white layer.

(16) Composition Ratio

The composition ratio was calculated from the results that the thickness of each layer was measured from the cross section photograph by the method as described in (15). In a case of the structure of A layer/B layer/C layer, when a base polyester has a number average molecular weight of 18500 to 40000 and only A layer contains 5 to 40% by weight of titanium dioxide, $$\text{Composition ratio (\%):} \quad \frac{\text{Thickness of } A \text{ layer}}{\text{Thickness of } A \text{ layer} + \text{thickness of } B \text{ layer} + \text{thickness of } C \text{ layer}} \times 100 \quad \text{(Equation 1)}$$

is used. The above-described calculation was performed. The number average molecular weight in each layer was measured by the above-described measuring method using the sample obtained from each layer.

(17) Particle Concentration of Layer Containing Titanium Dioxide

With reference to the concentration of titanium dioxide, the total amount of the sheet was measured by the method described in (2). The concentration of titanium dioxide particles in the layer containing titanium dioxide was calculated from the composition ratio and the obtained value was used as a particle concentration of the layer containing titanium dioxide.

(18) Ratio of the Layer Containing Titanium Dioxide (Based on the Whole Polyester Resin Sheet)

The ratio of the layer containing titanium dioxide was calculated from the results that the thickness of each layer was measured from the cross section photograph by the method as described in (15).

In a case of the structure of A layer/B layer/C layer, when only A layer contains 5 to 40% by weight of titanium dioxide, $$\text{Ratio of the layer containing titanium dioxide (\%):} \quad \frac{\text{Thickness of } A \text{ layer}}{\text{Thickness of } A \text{ layer} + \text{thickness of } B \text{ layer} + \text{thickness of } C \text{ layer}} \times 100 \quad \text{(Equation 2)}$$

is used. The above-described calculation was performed. The number average molecular weight in each layer was measured by the above-described measuring method using the sample obtained from each layer.

EXAMPLES

Hereinafter, the present invention will be specifically described with reference to Examples.

Examples 1 to 4

One hundred parts (parts by weight: hereinafter simply referred to as parts) of dimethyl terephthalate was mixed with 64 parts of ethylene glycol, to this, 0.1 parts of zinc acetate and 0.03 parts of antimony trioxide were added as catalysts. Ester interchange was performed with a circulation temperature of ethylene glycol.

Trimethyl phosphate (0.08 parts) was added to the resulting product, which was gradually heated up and polymerized under reduced pressure at a temperature of 271° C. for 5 hours. The inherent viscosity of the obtained polyethylene terephthalate was 0.55. The polymer was cut into a chip shape with a length of 4 mm, the chip shape of PET (polyethylene terephthalate) was cylindrical and had the size, length: 5.95 to 8.05 mm, width: 3.20 to 4.80 mm, and height: 1.70 to 2.30 mm. The specific gravity was 1.3 g/cm$^3$. The PET was placed in a rotary vacuum apparatus (rotary vacuum dryer) under conditions (high polymerization temperature: 190 to 230° C., degree of vacuum: 0.5 mmHg) and heated while stirring for 10 to 23 hours. Then, a PET polymer was obtained.

In the polymerization of PET used for the compound and base, the high polymerization temperature was changed to 190 to 230° C. and the high polymerization time was changed to 10 to 23 hours. Then, four types of PET polymers were obtained and inherent viscosities thereof were 0.60 (Example 1), 0.66 (Example 2), 0.73 (Example 3), 0.81 (Example 4), respectively. The four types of PET polymers and titanium dioxide fine particles were compounded to produce a master chip having 50% by weight of titanium dioxide. Since the specific gravity of the master chip was 2.5 g/cm$^3$, the master chip was formed into a chip shape with the size, length: 2.40 to 4.60 mm, width: 3.20 to 4.80 mm, and height: 1.70 to 2.30 mm so as to hardly generate classification. A titanium dioxide master chip (28% by weight) was added so that the concentration of titanium dioxide was 14% by weight based on a base polyester. These polymers were laminated by passing them through a laminating apparatus so as to be in the order of B layer/A layer/B layer and the resulting layer was formed into a sheet by T-die molding. Although the laminated constitution was a composite three layer structure, a substantially single layer (B layer/A layer/B layer=B layer/B layer/B layer) was produced using the same polymer as B layer for A layer. The polymerization degree of each layer (A layer, B layer) is therefore the same. Unstretched sheet, which was obtained by cooling-solidification of the sheet-like molded product discharged from a T-die on a cooling drum having a surface temperature of 25° C., was guided to a roll group heated up to 85 to 98° C., which was vertically stretched to a length 3.3 times longer in a longitudinal direction and then cooled by a roll group of 21 to 25° C. Subsequently, the vertically stretched film was guided to a tenter while both ends of the film were grasped by clips. Then, the film was stretched to a length 3.6 times longer in a direction perpendicular to a longitudinal direction under an atmosphere heated at 130° C. Thereafter, the resulting film was subjected to heat fixing at 220° C. in the tenter and uniformly slowly-cooled. Then, the film was cooled to room temperature and rolled up to obtain a sheet having a thickness of 50 μm.

The PET polymer to be passed through the A and B layers having an inherent viscosity of 0.60 was designated as sheet 2, the PET polymer having an inherent viscosity of 0.66 was designated as sheet 3, the PET polymer having an inherent viscosity of 0.73 was designated as sheet 4, and the PET polymer having an inherent viscosity of 0.81 was designated as sheet 5. On the other hand, oxidized silicon ($SiO_2$) was sputtered to a biaxial stretched polyester resin sheet (Lumiler (registered trademark) P11, produced by Toray Industries, Inc.) having, a thickness of 12 μm, and an oxidized silicon film having a thickness of 400 Å was obtained. The sputtered film was laminated onto sheets 2 to 5 via the following adhesive, which were designated as laminates 2 to 5:

Adhesive: urethane adhesive (Adcoat (registered trademark) 76P1: produced by Toyo-Morton, Ltd.)

The adhesive was blended with 10 parts by weight of main material and 1 part by weight of curing agent, which was adjusted to 30% by weight by using ethyl acetate. The adhesive was applied onto the non-sputtered surface of the sputtered film by the gravure roll method so as to have a coating thickness of 5 μm after solvent drying. The drying temperature was set to 100° C. Further, lamination was performed with a roll laminater under conditions at a temperature of 60° C. and a pressure of 1 kg/cm$^2$, and curing conditions were at 60° C. for three days.

Comparative Example 1

Sheet 1 of the PET polymer having an inherent viscosity of 0.55 (Comparative Example 1) was obtained in the same manner as described in Example 1 except that a master chip had 50% by weight of titanium dioxide fine particles having a number average particle diameter of 0.2 μm (the master chip had a cylindrical shape, and the size, length: 5.95 to 8.05 μmm, width: 3.20 to 4.80 mm, and height: 1.70 to 2.30 mm). It was laminated in the same manner as described in Example 1. The resulting product was designated as laminate 1.

The PET polymer to be passed through the A and B layers having a number average molecular weight of 41000 and a polymer inherent viscosity of 0.90 could not be extruded.

TABLE 1

| | (Polymerization degree) | | | | | |
|---|---|---|---|---|---|---|
| | Comparative example 1 | Example 1 | Example 2 | Example 3 | Example 4 | — |
| Number average molecular weight (Mn) of PET in A layer | same as that of PET in B layer | same as that of PET in B layer | same as that of PET in B layer | same as that of PET in B layer | same as that of PET in B layer | 41000 (No extrusion) |
| Number average molecular weight (Mn) of PET in B layer | 18300 | 18500 | 19800 | 27000 | 35000 | |
| Composition ratio (%) [B layer/(A layer + B layer)] | 100 | 100 | 100 | 100 | 100 | — |
| Type of particles | Titanium oxide | Titanium oxide | Titanium oxide | Titanium oxide | Titanium oxide | — |
| Concentration of titanium dioxide (wt %) | 14 | 14 | 14 | 14 | 14 | — |
| Apparent density | 1.42 | 1.42 | 1.42 | 1.42 | 1.42 | — |
| Hydrolysis resistance | x | Δ | Δ | ○ | ○ | — |
| Heat resistance (elongation retention) (%) | 11.6 | 45.8 | 47.1 | 53 | 63.1 | — |
| Optical density | 0.71 | 0.71 | 0.71 | 0.71 | 0.71 | — |

TABLE 1-continued (Polymerization degree)

| | Comparative example 1 | Example 1 | Example 2 | Example 3 | Example 4 | — |
|---|---|---|---|---|---|---|
| Variation in optical density (%) | 25.2 | 11.3 | 12.8 | 11.3 | 12.8 | — |
| Weatherability (resistance to UV rays) | ○ | ○ | ○ | ○ | ○ | — |
| UV transmittance (%) | 3.5 | 3.5 | 3.5 | 3.5 | 3.5 | — |
| Total light transmittance (%) | 11.8 | 11.8 | 11.5 | 11.7 | 11.5 | — |
| Water vapor transmission rate (gas barrier properties) (g/m2 [24 hr, thickness 0.1 mm conversion factor] | 0.45 | 0.45 | 0.45 | 0.45 | 0.45 | — |
| Dielectric constant | 3.3 | 3.3 | 3.3 | 3.3 | 3.3 | — |
| Relative reflectance | 83% | 85% | 84% | 83% | 84% | — |
| Processability | ○ | ○ | ○ | ○ | ○ | — |
| Intrinsic viscosity (PET in B layer) | 0.55 | 0.6 | 0.66 | 0.73 | 0.81 | 0.90 |
| Sample No. | Laminate 1 | Laminate 2 | Laminate 3 | Laminate 4 | Laminate 5 | — |

When the polyester resin sheet laminates for photovoltaic batteries of the present invention of Examples 1 to 4 are compared to that of Comparative Example 1, it is found that they are excellent in hydrolysis resistance. It is found that hydrolysis resistance and heat resistance are improved as the polymer with a higher polymerization degree is used. With reference to the variation in optical density, it is found that the type of small shape can tend to reduce the variation due to the difference in the chip shape.

Examples 5 to 7

The PET polymer as in B layer (number average molecular weight: 21000, inherent viscosity: 0.71, concentration of titanium dioxide particles: 14% by weight) was extruded to A layer in the same manner as described in Examples 1 to 4, and a substantially single layer structure (B layer/A layer/B layer=B layer/B layer/B layer) was produced. A sheet whose additive amount of titanium oxide in the single layer PET was 5% by weight was designated as sheet 7 (Example 5), a sheet whose additive amount was 14% by weight was designated as sheet 8 (Example 6), and a sheet whose additive amount was 40% by weight was designated as sheet 9 (Example 7). Three types of complex films were produced and the oxidized silicon sputtering film was laminated on one side of each sheet in the same manner as described in Examples 1 to 4. The laminates were designated as laminates 7 to 9. Other portions were determined in the same as described in Examples 1 to 4.

Comparative Examples 2 and 3

A polyester resin sheet was produced in the same manner as described in Example 5 except that the particle concentration and the shape of the master chip were changed. Titanium dioxide fine particles having a number average particle diameter of 0.2 μm were used as 50% by weight of master chip (chip shape: cylindrical, length: 5.95 to 8.05 mm, width: 3.20 to 4.80 mm, and height: 1.70 to 2.30 mm). The concentration of titanium dioxide was set to 4% by weight in Comparative Example 2 and the produced sheet was designated as sheet 6. A sheet laminated with a gas barrier layer was designated as laminate 6. The concentration of titanium dioxide was set to 45% by weight in Comparative Example 3 and the produced sheet was designated as sheet 10. A sheet laminated with a gas barrier layer was designated as laminate 10. The filter portion of the formed film was readily clogged. Thus, the furnace pressure was increased and the filter replacement was required. As a result, the productivity was poor.

TABLE 2

(Particle concentration)

| | Comparative example 2 | Example 5 | Example 6 | Example 7 | Comparative example 3 |
|---|---|---|---|---|---|
| Number average molecular weight (Mn) of PET in A layer | same as that of PET in B layer | same as that of PET in B layer | same as that of PET in B layer | same as that of PET in B layer | same as that of PET in B layer |
| Number average molecular weight (Mn) of PET in B layer | 21000 | 21000 | 21000 | 21000 | 21000 |
| Composition ratio (%) [B layer/(A layer + B layer)] | 100 | 100 | 100 | 100 | 100 |
| Type of particles | Titanium oxide | Titanium oxide | Titanium oxide | Titanium oxide | Titanium oxide |
| Concentration of titanium dioxide (wt %) | 4 | 5 | 14 | 40 | 45 |
| Apparent density | 1.36 | 1.37 | 1.42 | 1.65 | 1.75 |
| Hydrolysis resistance | ○ | ○ | ○ | ○ | ○ |
| Heat resistance (elongation retention) (%) | 47 | 47 | 57 | 47 | 39 |

TABLE 2-continued (Particle concentration)

|  | Comparative example 2 | Example 5 | Example 6 | Example 7 | Comparative example 3 |
|---|---|---|---|---|---|
| Optical density | 0.54 | 0.55 | 1.15 | 1.45 | 2.6 |
| Variation in optical density (%) | 35.4 | 19.2 | 7.8 | 4.1 | 1.2 |
| Weatherability (resistance to UV rays) | x | Δ | ○ | ○ | ○ |
| UV transmittance (%) | 11 | 10 | 3.5 | 0.005 | 0.004 |
| Total light transmittance (%) | 26.8 | 24.2 | 11.8 | 1.3 | 0.95 |
| Moisture vapor transmission rate (gas barrier properties) (g/m2 [24 hr, thickness 0.1 mm conversion factor] | 0.25 | 0.3 | 0.33 | 0.35 | 0.45 |
| Dielectric constant | 3.1 | 3.1 | 3.3 | 3.3 | 3.3 |
| Relative reflectance | 79 | 81 | 85 | 87 | 89 |
| Processability | ○ | ○ | ○ | Δ | x |
| Intrinsic viscosity (PET in B layer) | 0.71 | 0.71 | 0.71 | 0.71 | 0.71 |
| Sample No. | Laminate 6 | Laminate 7 | Laminate 8 | Laminate 9 | Laminate 10 |

When the polyester resin sheet laminates for photovoltaic batteries of the present invention of Examples 5 to 7 are compared to that of Comparative Example 2, it is found that they are excellent in optical density, variation in optical density, total light transmittance, reflectance, and resistance to UV rays. It is found that optical density, variation in optical density, total light transmittance, reflectance, and resistance to UV rays are similarly improved as the particle concentration is further increased. However, when the particle concentration is increased too much, gas barrier properties worsen. Thus, it is found that the processability and productivity tends to be poor.

Examples 8 to 10

The number average molecular weight of the PET in B layer was 21000, the inherent viscosity therein was 0.71, the number average molecular weight of the PET in A layer was 18300, and the inherent viscosity therein was 0.55 (concentrations of titanium dioxide particles of the PET in both layers were 14% by weight). These polymers were laminated by passing them through a laminating apparatus so as to be in the order of B layer/A layer/B layer and the resulting layer was formed into a sheet by T-die molding. The laminated constitution is a composite three layer structure. Unstretched sheet, which was obtained by cooling-solidification of the sheet-like molded product discharged from a T-die on a cooling drum having a surface temperature of 25° C., was guided to a roll group heated up- to 85 to 98° C., which was vertically stretched to a length 3.3 times longer in a longitudinal direction and then cooled by a roll group of 21 to 25° C. Subsequently, the vertically stretched film was guided to a tenter while both ends of the film were grasped by clips. Then, the film was stretched to a length 3.6 times longer in a direction perpendicular to a longitudinal direction under an atmosphere heated at 130° C. Thereafter, the resulting film was subjected to heat fixing at 220° C. in the tenter and uniformly slowly-cooled. Then, the film was cooled to room temperature and rolled up to obtain a sheet having a thickness of 250 μm.

A sheet in which the composition ratio of B layer/A layer/B layer [B layer/(A layer+B layer)] was 7.2% was designated as sheet 12 (Example 8), a sheet in which the composition ratio was 15% was designated as sheet 13 (Example 9), and a sheet in which the composition ratio was 20% was designated as sheet 14 (Example 10). With reference to the stretching method, aluminium was vacuum metallized on one side of the sheet in a thickness of 600 Å. The metallizing was performed for the purpose of gas barrier properties at the time of use of the photovoltaic battery.

Oxidized silicon ($SiO_2$) was sputtered to a biaxial stretched polyester resin film (Lumiler (registered trademark) P11, produced by Toray Industries, Inc.) having a thickness of 12 μm and an oxidized silicon film having a thickness of 400 Å was obtained. A polyurethane adhesive with a solid content of 30% by weight, produced by Takeda Pharmaceutical Company Limited (main material: Takerak A515/curing agent Takenate A50=10/1 solution) was applied on the surface of vapor-deposited thin film of the above-described sputtered film as the adhesive at a coating amount of 5 g/m² (dry state) with a dry laminating machine and then dried. The resulting film was laminated with sheets 12 to 14. The layered products in which gas barrier layers were thus provided on both sides were designated as layered products 12 to 14.

Example 11

The number average molecular weight of the PET in A and B layers was 21000 and the inherent viscosity therein was 0.71 (concentrations of titanium dioxide particles of the PET in both layers were 14% by weight). These polymers were laminated by passing them through a laminating apparatus so as to be in the order of B layer/A layer/B layer and the resulting layer was formed into a sheet by T-die molding. The laminated constitution is a composite three layer structure. Unstretched sheet, which was obtained by cooling-solidification of the sheet-like molded product discharged from a T-die on a cooling drum having a surface temperature of 25° C., was guided to a roll group heated up to 85 to 98° C., which was vertically stretched to a length 3.3 times longer in a longitudinal direction and then cooled by a roll group of 21 to 25° C. Subsequently, the vertically stretched film was guided to a tenter while both ends of the film were grasped by clips. Then, the film was stretched to a length 3.6 times longer in a direction perpendicular to a longitudinal direction under an atmosphere heated at 130° C. Thereafter, the resulting film was subjected to heat fixing at 220° C. in the tenter and uniformly slowly-cooled. Then, the film was cooled to room temperature and rolled up to obtain a sheet having a thickness of 250 µm.

The composition ratio of B layer/A layer/B layer [B layer/(A layer+B layer)] was 100% and various physical properties of sheet 15 (Example 11) on which the gas barrier layer was not provided were measured in the same manner.

Comparative Examples 4 and 5

The number average molecular weight of the PET in B layer was 21000, the inherent viscosity therein was 0.71, the number average molecular weight of the PET in A layer was 18300, and the inherent viscosity therein was 0.55 (concentrations of titanium dioxide particles of the PET in both layers were 14% by weight). These polymers were laminated by passing them through a laminating apparatus so as to be in the order of B layer/A layer/B layer and the resulting layer was formed into a sheet by T-die molding. The laminated constitution is a composite three layer structure.

A sheet whose composition ratio of B layer/A layer/B layer [B layer/(A layer+B layer)] was 6% (Comparative Example 4) was obtained. In Comparative Example 5, the same PET as the PET in A layer (number average molecular weight: 18300, inherent viscosity: 0.55) was used for the PET in B layer. The sheet was stretched to a length 3.0 times longer in a longitudinal direction at a temperature of 90° C. by the sequential biaxial stretching method. Then, the film was supplied to the following tenter and stretched to a length 3.0 times longer in a width direction at a temperature of 95° C. Thereafter, heat treatment was carried out at 220° C. and two types of sheets having a thickness of 250 µm were obtained. A laminate was obtained in the same manner as described in Example 8.

The laminate whose composition ratio was 6% was used and the gas barrier layer was laminated by the method of Example 8. The resulting product was designated as sheet 11. Similarly, the same PET as the PET in A layer (number average molecular weight: 18300) was used for the PET in B layer and the obtained product was designated as sheet 16.

Comparative Example 6

Fluorine film "Tedler" TWH20BS3 (50 µm) produced by Du Pont Inc. was used and the sheet was designated as sheet 17. As for the sheet 17, the same item as that of other Examples was measured.

TABLE 3

| | Comparative example 4 | Example 8 | Example 9 | Example 10 | Example 11 | Comparative example 5 | Comparative example 6 |
|---|---|---|---|---|---|---|---|
| (Lamination ratio) | | | | | | | |
| Number average molecular weight (Mn) of PET in A layer | 18300 | 18300 | 18300 | 18300 | same as that of PET in B layer | 18300 | — |
| Number average molecular weight (Mn) of PET in B layer | 21000 | 21000 | 21000 | 21000 | 21000 | same as that of PET in A layer | — |
| Composition ratio (%) [B layer/(A layer + B layer)] | 6 | 7.2 | 15 | 20 | 100 | — | — |
| Type of particles | Titanium dioxide | Titanium dioxide | Titanium dioxide | Titanium dioxide | Titanium dioxide | Titanium dioxide | — |
| Concentration of titanium dioxide (wt %) | 14 | 14 | 14 | 14 | 14 | 14 | — |
| Apparent density | 1.42 | 1.42 | 1.42 | 1.42 | 1.42 | 1.42 | 2.1 |
| Hydrolysis resistance | x | Δ | ○ | ○ | ○ | x | ● |
| Heat resistance (elongation retention) (%) | 7.5 | 45.8 | 57.1 | 63 | 75 | 2.5 | 95 |
| Optical density | 1.47 | 1.45 | 1.45 | 1.5 | 1.45 | 1.51 | 0.75 |
| Variation in optical density (%) | 2.8 | 2.8 | 2.8 | 2.8 | 2.8 | 2.8 | — |
| Weatherability (resistance to UV rays) | ○ | ○ | ○ | ○ | ○ | ○ | ○ |
| UV transmittance (%) | 0.7 | 0.7 | 0.7 | 0.7 | 0.7 | 0.7 | 2.1 |
| Total light transmittance (%) | 1.4 | 1.5 | 1.3 | 1.6 | 1.3 | 1.9 | 2.9 |
| Moisture vapor transmission rate (gas barrier properties) (g/m2 [24 hr, thickness 0.1 mm conversion factor] | 0.15 | 0.15 | 0.15 | 0.15 | 6.4 | 0.15 | 5 or more |
| Relative reflectance (%) | 79.8 | 82 | 83 | 85 | 95 | 83 | 75 |
| Processability | ○ | ○ | ○ | ○ | ○ | ○ | x |
| Intrinsic viscosity (PET in A layer) | 0.55 | 0.55 | 0.55 | 0.55 | 0.71 | 0.55 | — |
| Intrinsic viscosity (PET in B layer) | 0.71 | 0.71 | 0.71 | 0.71 | 0.71 | 0.55 | — |
| Sample No. | Laminate 11 | Laminate 12 | Laminate 13 | Laminate 14 | Sheet 15 | Laminate 16 | Sheet 17 |

The polyester resin sheets for photovoltaic batteries of Examples 8 to 10 are remarkably excellent in hydrolysis resistance as compared to that of Comparative Example 4. Further, the sheets satisfy various characteristics such as gas barrier properties, total light transmittance, and reflectivity. On the other hand, in Examples 8 to 10, the hydrolysis resistance is improved as a high-molecular weight layer having a high number average molecular weight is increased. It is found that preferably, the lamination ratio needs to be 7% or more (preferably, 15% or more). The best condition is when the high-molecular weight layer is used for all. The polyester resin sheet for photovoltaic batteries of Comparative Example 6 is formed by using polyvinyl fluoride sheet which is used for the art among fluorine sheets. It is excellent in weatherability, hydrolysis resistance, and light reflectivity, however, gas barrier properties and the nerve of the sheet are weak and the processability of photovoltaic batteries is poor. To apply to the art, it is necessary to make the sheet thicker and form a relatively thick metal layer as the gas barrier layer. The sheet has a high apparent density. Taking into consideration this fact, the sheet goes against the reduction in weight which has recently been required.

Examples 12 to 19

The number average molecular weight of the PET in B layer was 21000, the inherent viscosity therein was 0.71 (the concentration of titanium dioxide particles in B layer, 20% by weight), the number average molecular weight and the titanium dioxide content of the PET in A layer were as described in Table 4, the number average molecular weight of the PET in C layer was 17450, and the inherent viscosity therein was 0.50 (the concentration of titanium dioxide particles in C layer, 0% by weight). These polymers were laminated by passing them through a laminating apparatus so as to be in the order of B layer/A layer/B layer/C layer and the resulting layer was formed into a sheet by T-die molding. The laminated constitution is a composite four layer structure. Unstretched sheet, which was obtained by cooling-solidification of the sheet-like molded product discharged from a T-die on a cooling drum having a surface temperature of 25° C., was guided to a roll group heated up to 85 to 98° C., which was vertically stretched to a length 3.3 times longer in a longitudinal direction and then cooled by a roll group of 21 to 25° C. Subsequently, the vertically stretched film was guided to a tenter while both ends of the film were grasped by clips. Then, the film was stretched to a length 3.6 times longer in a direction perpendicular to a longitudinal direction under an atmosphere heated at 130° C. Thereafter, the resulting film was subjected to heat fixing at 220° C. in the tenter and uniformly slowly-cooled. Then, the film was cooled to room temperature and rolled up. Sheets having respective thicknesses were obtained for each of Examples. The thickness is changed depending on the composition ratio of B layer/A layer/B layer/C layer for each of Examples, C layer is discharged, and the ratio of the layer containing titanium dioxide is changed. A sheet in which the total thickness of the polyester resin sheet was 325 μm, the ratio of the layer containing titanium dioxide [B layer/(A layer+B layer+C layer)] was 5.5% based on the total sheet, the thickness of B layer/A layer/B layer was 250 μm, and the composition ratio of [B layer/(A layer+B layer)] was 7.2% was designated as sheet 19 (Example 12). A sheet in which the total thickness of the polyester resin sheet was 313 μm, the ratio of the layer containing titanium dioxide was 9% based on the total sheet, the thickness of B layer/A layer/B layer was 188 μm, and the composition ratio of [B layer/(A layer+B layer)] was 15% was designated as sheet 20 (Example 13). A sheet in which the total thickness of the polyester resin sheet was 238 μm, the ratio of the layer containing titanium dioxide was 16% based on the total sheet the thickness of B layer/A layer/B layer was 188 μm, and the composition ratio of [B layer/(A layer+B layer)] was 20% was designated as sheet 21 (Example 14). A sheet in which the total thickness of the polyester resin sheet was 175 μm, the ratio of the layer containing titanium dioxide was 17% based on the total sheet, the thickness of B layer/A layer/B layer was 100 μm, and the composition ratio of [B layer/(A layer+B layer)] was 30% was designated as sheet 22 (Example 15). A sheet in which the total thickness of the polyester resin sheet was 263 g/m, the ratio of the layer containing titanium dioxide was 21% based on the total sheet, the thickness of B layer/A layer/B layer was 188 μm, and the composition ratio of [B layer/(A layer+B layer)] was 30% was designated as sheet 23 (Example 16). A sheet in which the total thickness of the polyester resin sheet was 300 μm, the ratio of the layer containing titanium dioxide was 17% based on the total sheet, the thickness of B layer/A layer/B layer was 50 μm, and the composition ratio of [B layer/(A layer+B layer)] was 100% was designated as sheet 24 (Example 17). A sheet in which the total thickness of the polyester resin sheet was 238 μm, the ratio of the layer containing titanium dioxide was 21% based on the total sheet, the thickness of B layer/A layer/B layer was 50 μm, and the composition ratio of [B layer/(A layer+B layer)] was 100% was designated as sheet 25 (Example 18). A sheet in which the total thickness of the polyester resin sheet was 125 μm, the ratio of the layer containing titanium dioxide was 40% based on the total sheet, the thickness of B layer/A layer/B layer was 50 μm, and the composition ratio of [B layer/(A layer+B layer)] was 100% was designated as sheet 26 (Example 19). With reference to Examples 12 to 19, aluminium was vacuum metallized on one side of the sheet from B layer in a thickness of 600 Å. In this regard, each optical property was measured from the side of the B layer.

Comparative Example 7

The number average molecular weight of PET in B layer was 21000, the inherent viscosity therein was 0.71, the number average molecular weight of PET in A layer was 18300, the inherent viscosity therein was 0.55, the number average molecular weight of PET in C layer was 17450, the inherent viscosity therein was 0.50, and the concentration of titanium dioxide particles in B layer was 20% by weight. These polymers were laminated by passing them through a laminating apparatus so as to be in the order of B layer/A layer/B layer/C layer and the resulting layer was formed into a sheet by T-die molding. The laminated constitution is a composite three layer structure. Unstretched sheet, which was obtained by cooling solidification of the sheet-like molded product discharged from a T-die on a cooling drum having a surface temperature of 25° C., was guided to a roll group heated up to 85 to 98° C., which was vertically stretched to a length 3.3 times longer in a longitudinal direction and then cooled by a roll group of 21 to 25° C. Subsequently, the vertically stretched film was guided to a tenter while both ends of the film were grasped by clips. Then, the film was stretched to a length 3.6 times longer in a direction perpendicular to a longitudinal direction under an atmosphere heated at 130° C. Thereafter, the resulting film was subjected to heat fixing at 220° C. in the tenter and uniformly slowly-cooled. Then, the film was cooled to room temperature and rolled up to obtain a sheet having a thickness of 313 μm. The thickness of B layer/A layer/B layer was 188 μm, the composition ratio of [B layer/(A layer+B layer)] was 6%, and the ratio of the layer containing titanium dioxide in [B layer/(A layer+B layer+C layer)] was 4.8%. Subsequently, in the same manner as described in Examples 12 to 19, aluminium was vacuum metallized on one side of the sheet from B layer in a thickness of 600 Å. In this regard, each optical property was measured from the side of the B layer.

Ratio of the Layer Containing Titanium Dioxide (Based on the Whole Polyester Resin Sheet)

TABLE 4

| | Comparative example 7 | Example 12 | Example 13 | Example 14 | Example 15 | Example 16 | Example 17 | Example 18 | Example 19 |
|---|---|---|---|---|---|---|---|---|---|
| | (Combination of lamination) | | | | | | | | |
| Number average molecular weight (Mn) of PET in A layer | 18300 (without titanium) | 18300 (without titanium) | 18300 (without titanium) | 18300 (without titanium) | same as that of PET in B layer (without | same as that of PET in B layer (without | same as that of PET in B layer | same as that of PET in B layer | same as that of PET in B layer |
| Number average molecular weight (Mn) of PET in B layer | 21000 | 21000 | 21000 | 21000 | 21000 | 21000 | 21000 | 21000 | 21000 |
| Composition ratio (%) [B layer/(A layer + B layer)] | 6 | 7.2 | 15 | 20 | 30 | 30 | 100 | 100 | 100 |
| Type of particles | Titanium dioxide | Titanium dioxide | Titanium dioxide | Titanium dioxide | Titanium dioxide | Titanium dioxide | Titanium dioxide | Titanium dioxide | Titanium dioxide |
| Concentration of titanium dioxide (wt %) (B layer) | 20 | 20 | 20 | 20 | 20 | 20 | 20 | 20 | 20 |
| Ratio of the Layer Containing Titanium Dioxide (Based on the Whole Polyester Resin Sheet) (%) | 4.5 | 5.5 | 9 | 16 | 17 | 21 | 17 | 21 | 40 |
| Apparent density | 1.4 | 1.4 | 1.4 | 1.41 | 1.41 | 1.41 | 1.42 | 1.42 | 1.43 |
| Hydrolysis resistance | ○ | ○ | ○ | ○ | ○ | ○ | ○ | ○ | ○ |
| Heat resistance (elongation retention) (%) | 36 | 42 | 45 | 57 | 63 | 65 | 73 | 73 | 73 |
| Optical density | 0.5 | 0.65 | 0.8 | 0.85 | 0.85 | 1.05 | 0.88 | 0.82 | 0.75 |
| Variation in optical density (%) | 21 | 19.2 | 11.5 | 10.2 | 9.5 | 7.8 | 8.8 | 12.8 | 12.8 |
| Weatherability (resistance to UV rays) | • | Δ | ○ | ○ | ○ | ○ | ○ | ○ | ○ |
| UV transmittance (%) | 1.3 | 0.25 | 0.14 | 0.14 | 0.09 | 0.01 | 0.02 | 0.03 | 0.11 |
| Total light transmittance (%) | 26 | 20.5 | 20.2 | 18.5 | 17.1 | 10.1 | 13.2 | 13.5 | 14.6 |
| Moisture vapor transmission rate (gas barrier properties) (g/m2) [24 hr, thickness 0.1 mm conversion factor] | 0.35 | 0.35 | 0.35 | 0.35 | 0.35 | 0.35 | 0.35 | 0.35 | 0.35 |
| Relative reflectance (%) | 79 | 81 | 85 | 87 | 90 | 90 | 89 | 89 | 89 |
| Processability | ○ | ○ | ○ | ○ | ○ | ○ | ○ | ○ | ○ |
| Intrinsic viscosity (PET in A layer) | 0.55 | 0.55 | 0.55 | 0.55 | 0.71 | 0.71 | 0.71 | 0.71 | 0.71 |
| Intrinsic viscosity (PET in B layer) | 0.71 | 0.71 | 0.71 | 0.71 | 0.71 | 0.71 | 0.71 | 0.71 | 0.71 |
| Sample No. | Sheet 18 | Sheet 19 | Sheet 20 | Sheet 21 | Sheet 22 | Sheet 23 | Sheet 24 | Sheet 25 | Sheet 26 |

The film thickness is important to improve the withstand pressure of the partial discharge Inception Voltage. The coextrusion of the polyester resin layer of the invention in the present application and other polyester layers is performed to increase the thickness. As is apparent from Table 4, even coextruded polyester resin sheet for photovoltaic batteries is formed of a plurality of polyester resin layers. It is found out that suitable characteristics can be obtained when the thickness of the layer having 5 to 40% by weight of titanium dioxide is 7% or more of the total thickness of the polyester resin sheet. In Comparative Example 7, when the thickness of the layer containing titanium dioxide is less than 7% of the total thickness of the sheet, the weatherability and optical property are not satisfied. The optical property is improved as the ratio of the layer containing titanium dioxide becomes higher. Thus, it is preferable that the ratio be increased so as to satisfy the above-described range in the polyester resin sheet for photovoltaic batteries. However, for the purpose of cost reduction, a method for increasing the thickness by combining sheets other than the polyester resin sheet for photovoltaic batteries of the present invention can be contemplated.

INDUSTRIAL APPLICABILITY

The polyester resin sheet for photovoltaic batteries of the present invention can be suitably used for photovoltaic batteries to be used as roofing materials, photovoltaic batteries having flexibility, and electronic parts.

The invention claimed is:

1. A polyester resin sheet comprising a polyester resin layer formed by using one or more layers having a number average molecular weight (Mn) of 18500 to 40000 in which at least one or more layers having 5 to 40% by weight of titanium dioxide is formed on the polyester resin layer, wherein
  a total thickness of the B layer(s) is 9 to 40% of the total thickness of the polyester resin layer, and
  at least one B layer is placed on the outermost layer, and
    a light transmittance of the polyester resin sheet at wavelengths of 300 to 350 nm is 0.005 to 10%,
    a relative reflectance of the polyester resin sheet is 80% or more and 105% or less,
    an apparent density of the polyester resin sheet is 1.37 to 1.65 g/cm$^3$,
    an optical density is of the polyester resin sheet 0.55 to 3.50, and
    the variation in optical density of the polyester resin sheet has a fluctuation of within 20% from the center value.

2. The polyester resin sheet according to claim 1, wherein the variation in optical density has a fluctuation of within 15% from the center value.

3. The polyester resin sheet according to claim 1, wherein total light transmittance of a thermoplastic resin sheet is 0.005 to 25%.

4. The polyester resin sheet according to claim 1, wherein elongation retention before and after aging for 3000 hours is 40 to 100% under conditions of a temperature of 85° C. and a humidity of 85% RH.

5. The polyester resin sheet according to claim 1, wherein elongation retention before and after aging for 15 hours is 40 to 100% under condition of a temperature of 140° C.

6. The polyester resin sheet according to claim 1, comprising a gas and moisture vapor barrier layer.

7. A polyester resin sheet laminate, wherein at least the polyester resin sheet according to claim 1 and a gas and moisture vapor barrier layer are laminated.

8. The polyester resin sheet laminate according to claim 7, wherein a moisture vapor transmission rate is 0.5 g/(m$^2$·24 hr) or less using 100 μm conversion factor at a temperature of 40° C. and a humidity of 90% RH in the measurement of moisture vapor transmission rate measurement in accordance with JIS-K-7129.

9. A photovoltaic battery backside protection sheet, wherein the photovoltaic battery backside protection sheet is the polyester resin sheet for photovoltaic batteries or the polyester resin sheet laminate for photovoltaic batteries according to claim 1 and used for a back sealing material of photovoltaic batteries.

10. A photovoltaic battery module, wherein the photovoltaic battery backside protection sheet according to claim 9 is used.

11. A photovoltaic battery backside protection sheet, wherein the photovoltaic battery backside protection sheet is the polyester resin sheet for photovoltaic batteries or the polyester resin sheet laminate for photovoltaic batteries according to claim 2 and used for a back sealing material of photovoltaic batteries.

12. A photovoltaic battery backside protection sheet, wherein the photovoltaic battery backside protection sheet is the polyester resin sheet for photovoltaic batteries or the polyester resin sheet laminate for photovoltaic batteries according to claim 3 and used for a back sealing material of photovoltaic batteries.

13. A photovoltaic battery backside protection sheet, wherein the photovoltaic battery backside protection sheet is the polyester resin sheet for photovoltaic batteries or the polyester resin sheet laminate for photovoltaic batteries according to claim 4 and used for a back sealing material of photovoltaic batteries.

14. A photovoltaic battery backside protection sheet, wherein the photovoltaic battery backside protection sheet is the polyester resin sheet for photovoltaic batteries or the polyester resin sheet laminate for photovoltaic batteries according to claim 5 and used for a back sealing material of photovoltaic batteries.

15. A photovoltaic battery backside protection sheet, wherein the photovoltaic battery backside protection sheet is the polyester resin sheet for photovoltaic batteries or the polyester resin sheet laminate for photovoltaic batteries according to claim 6 and used for a back sealing material of photovoltaic batteries.

16. A photovoltaic battery backside protection sheet, wherein the photovoltaic battery backside protection sheet is the polyester resin sheet for photovoltaic batteries or the polyester resin sheet laminate for photovoltaic batteries according to claim 7 and used for a back sealing material of photovoltaic batteries.

17. A photovoltaic battery backside protection sheet, wherein the photovoltaic battery backside protection sheet is the polyester resin sheet for photovoltaic batteries or the polyester resin sheet laminate for photovoltaic batteries according to claim 7 and used for a back sealing material of photovoltaic batteries.

18. The polyester resin sheet according to claim 1, wherein the polyester resin layer(s) (B layer(s)) having 5 to 40% by weight of titanium dioxide has/have number average molecular weight (Mn) of 18500 to 35000.

* * * * *

UNITED STATES PATENT AND TRADEMARK OFFICE
CERTIFICATE OF CORRECTION

PATENT NO. : 7,872,092 B2
APPLICATION NO. : 12/282382
DATED : January 18, 2011
INVENTOR(S) : Fujii et al.

Page 1 of 1

It is certified that error appears in the above-identified patent and that said Letters Patent is hereby corrected as shown below:

In Column 27

At Table 4, at "Comparative example 7", row five, change "4.5" to --4.8--; and at "Example 18", row 10, please change "12.8" to --11.8--.

Signed and Sealed this
Sixteenth Day of August, 2011

David J. Kappos
*Director of the United States Patent and Trademark Office*